United States Patent
Hao et al.

(10) Patent No.: US 11,549,996 B1
(45) Date of Patent: Jan. 10, 2023

(54) AUTOMATICALLY DETERMINING THE SIZE OF A CAPACITOR BANK USING WIRELESS CURRENT SENSORS (WCS)

(71) Applicant: Schweitzer Engineering Laboratories, Inc., Pullman, WA (US)

(72) Inventors: Kei Hao, Anaheim, CA (US); Raymond W. Rice, Pullman, WA (US); James Mobley, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 17/454,172

(22) Filed: Nov. 9, 2021

(51) Int. Cl.
*G01R 31/40* (2020.01)
*G01R 31/3842* (2019.01)
*H02H 7/16* (2006.01)

(52) U.S. Cl.
CPC ......... *G01R 31/40* (2013.01); *G01R 31/3842* (2019.01); *H02H 7/16* (2013.01)

(58) Field of Classification Search
CPC ....... G01R 31/40; G01R 31/3842; H02H 7/16
USPC ................................ 324/686, 658, 649, 600
See application file for complete search history.

(56) References Cited

U.S. PATENT DOCUMENTS

| | | | |
|---|---|---|---|
| 4,689,752 A | 8/1987 | Fernandes | |
| 4,709,339 A | 11/1987 | Fernandes | |
| 4,794,328 A | 12/1988 | Fernandes | |
| 5,168,414 A | 12/1992 | Horstmann | |
| 5,220,311 A | 6/1993 | Schweitzer | |
| 5,420,502 A | 5/1995 | Schweitzer | |
| 5,550,476 A | 8/1996 | Lau | |
| 5,565,783 A | 10/1996 | Lau | |
| 5,656,931 A | 8/1997 | Lau | |
| 5,670,864 A | 9/1997 | Marx | |
| 6,002,260 A | 12/1999 | Lau | |
| 6,014,301 A | 1/2000 | Schweitzer | |
| 6,016,105 A | 1/2000 | Schweitzer | |
| 6,133,723 A | 10/2000 | Feight | |
| 6,133,724 A | 10/2000 | Schweitzer | |
| 6,429,661 B1 | 8/2002 | Schweitzer | |
| 6,433,698 B1 | 8/2002 | Schweitzer | |
| 6,479,981 B2 | 11/2002 | Schweitzer | |
| 6,734,662 B1 | 5/2004 | Fenske | |
| 6,822,576 B1 | 11/2004 | Feight | |
| 6,894,478 B1 | 5/2005 | Fenske | |
| 6,949,921 B1 | 9/2005 | Feight | |
| 6,963,197 B1 | 11/2005 | Feight | |

(Continued)

*Primary Examiner* — Giovanni Astacio-Oquendo
(74) *Attorney, Agent, or Firm* — Bradley W. Schield

(57) ABSTRACT

The present disclosure relates to a capacitor bank controller that automatically determines the size of a capacitor bank using wireless current sensors. The capacitor bank controller determines a first capacitor bank size estimate using voltage and current measurements from when the capacitor bank is open and when the capacitor bank is closed a first time. The capacitor bank controller determines a second capacitor bank size estimate by using voltage measurements and current measurements from when the capacitor bank is open and when the capacitor bank is closed a second time. The capacitor bank controller determines a filtered capacitor bank size estimate based on the first capacitor bank estimate and the second capacitor bank estimate and controls operation of the capacitor bank based on the filtered capacitor bank size estimate.

20 Claims, 6 Drawing Sheets

(56) References Cited

U.S. PATENT DOCUMENTS

| | | |
|---|---|---|
| 7,053,601 B1 | 5/2006 | Fenske |
| 7,106,048 B1 | 9/2006 | Feight |
| 7,271,580 B1 | 9/2007 | Fenske |
| 7,315,169 B1 | 1/2008 | Fenske |
| 7,382,272 B2 | 6/2008 | Feight |
| 7,725,295 B2 | 5/2010 | Stoupi |
| 8,059,006 B2 | 11/2011 | Schweitzer |
| 8,575,941 B2 | 11/2013 | Samineni |
| 8,650,411 B2 | 2/2014 | Feight |
| 8,665,102 B2 | 3/2014 | Salewske |
| 10,419,064 B2 | 9/2019 | Cosic |
| 11,075,519 B2 * | 7/2021 | Hao .................. H02J 3/1828 |
| 11,114,858 B2 | 9/2021 | Hao |
| 11,435,403 B2 | 9/2022 | Hao |
| 2008/0077336 A1 | 3/2008 | Fernandes |
| 2010/0013632 A1 | 1/2010 | Salewske |
| 2010/0283435 A1 * | 11/2010 | Bremer ............... H02J 3/1828 323/211 |
| 2013/0128393 A1 | 5/2013 | Gajic |
| 2015/0145536 A1 | 5/2015 | Kuenen |
| 2016/0196526 A1 | 7/2016 | Khalid |
| 2021/0083478 A1 | 3/2021 | Hao |
| 2021/0088555 A1 * | 3/2021 | Hao .................. G01R 15/18 |
| 2021/0088595 A1 | 3/2021 | Hao |
| 2021/0109558 A1 | 4/2021 | Hao |

* cited by examiner

AUTOMATICALLY DETERMINING THE SIZE OF A CAPACITOR BANK USING WIRELESS CURRENT SENSORS (WCS)

TECHNICAL FIELD

The present disclosure relates generally to capacitor bank control and, more particularly, to techniques to automatically learn the size of a capacitor bank in power systems that use wireless current sensors (WCSs).

BRIEF DESCRIPTION OF THE DRAWINGS

Non-limiting and non-exhaustive embodiments of the disclosure are described herein, including various embodiments of the disclosure with reference to the figures listed below.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Electric power delivery systems include equipment, such as generators, power lines, transformers, and the like, to provide electrical energy from a source to one or more loads. Various intelligent electronic devices (IEDs) may be used in monitoring and control of the power delivery system. For example, capacitor bank controllers (CBCs) may control capacitor banks in the power delivery system to control delivery of reactive power. To perform control operations, the CBC may receive voltage measurements and current measurements of a power line. Depending on the voltage and current on the power line, the CBC may send signal(s) to connect or disconnect the capacitor bank to improve the quality of power being delivered. For instance, the CBC may provide for power factor correction, kilovolt-ampere reactive (kVAR) support, or voltage improvement.

During commissioning, an operator may input various settings into the CBC. For example, the operator may enter the size of the capacitor bank that the CBC is controlling. However, these inputs may be cumbersome resulting in longer or incorrect installations. In some cases, operators may be unaware of the size of the capacitor bank or may input the incorrect size into the CBC. To reduce the settings input by an operator of the CBC, as explained below, the CBC may automatically determine the size of the capacitor bank based on voltage and current measurements while the capacitor bank is connected and disconnected.

Figure 1:
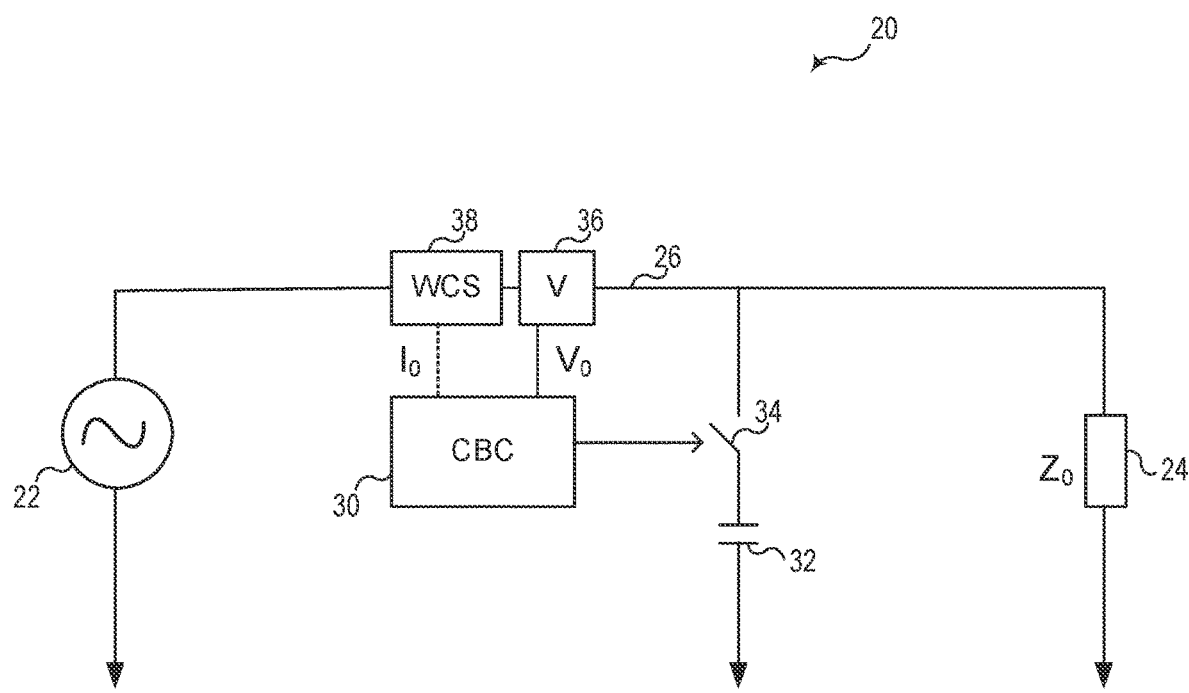
FIG. 1 is a circuit diagram of a power system in which a capacitor bank controller (CBC) has disconnected a capacitor bank from the power system, in accordance with an embodiment.

FIG. 1 illustrates a circuit diagram of an embodiment of an electric power delivery system 20, which may have various electric transmission lines, electric distribution lines, current transformers, buses, switches, circuit breakers, reclosers, transformers, autotransformers, tap changers, voltage regulators, capacitor banks, generators, motors, pumps, compressors, valves, and a variety of other types of monitored equipment. For illustrative purposes, the electric power delivery system 20 includes a power source 22 and a load 24. The electric power delivery system 20 includes a power line 26 that is communicatively coupled between the power source 22 and the load 24 to deliver power from the power source 22 to the load 24.

The electric power delivery system 20 may be monitored by capacitor bank controller (CBC) 30 that controls a capacitor bank 32 by sending signals to a switch 34 to electrically connect or disconnect the capacitor bank 32 from the power line 26. While illustrated as a single capacitor, note that several capacitors may be used and the particular size of the capacitor bank may depend on the application. Further, although illustrated in single-line form for purposes of simplicity, the electric power delivery system 20 may be a multi-phase system, such as a three-phase electric power delivery system.

The CBC 30 may obtain electric power system information using one or more sensors. Some CBCs may use line post sensors mounted on a power line or other structure of the power line post to monitor the current and/or voltage of the power line. Alternatively and/or additionally, wireless current sensors (WCSs) may be used in combination with line mounted voltage sensors to obtain current and voltage of the power line. WCSs may have limited ability to communicate current measurements to the CBC 30. For example, WCSs may use harvested power from the power line 26 and/or stored energy in an energy storage device, such as a rechargeable battery, charging capacitor, etc. Due to the energy limitations, WCSs may not be able to provide constant communication to the CBC in the same manner as line post sensors.

As explained below, different methods to automatically obtain the size of a capacitor bank may be performed in a manner that allows wireless current sensors to be used. By taking repeated measurements and selecting reliable measurements, the CBC may automatically obtain a capacitor bank size that is accurate. Further, by having a protocol/scheme between the WCS and the CBC, the WCS may charge the energy storage device to enable obtaining measurements closer in time. For example, the WCS may be charged to obtain a sample before closing a switching device of the CBC and after closing the switching device to reduce changes caused by loads being added/removed.

As illustrated, the CBC 30 may obtain a first voltage measurement ($V_o$) from a voltage sensor 36 and a first current measurement ($I_0$) from a wireless current sensor (WCS) 38 indicating the voltage and current of the power line 26 while the switching device 34 in a first state (e.g., open state) in which the capacitor bank 32 is electrically disconnected from the power line 26. A first equivalent load impedance $Z_0$ of the electric power system 20 may be determined as:

$$Z_0 = \frac{V_0}{I_0} \qquad \text{Eq. 1}$$

where $Z_0$ is the impedance from the $V_0$ and $I_0$ measurements without the capacitor bank connected. The CBC 30 may obtain the $V_0$ and $I_0$ measurements immediately preceding closing the switching device 34 via the voltage sensor 36 and the WCS 38. In some embodiments, the voltages may be obtained over an integer number of cycles.

Figure 2:
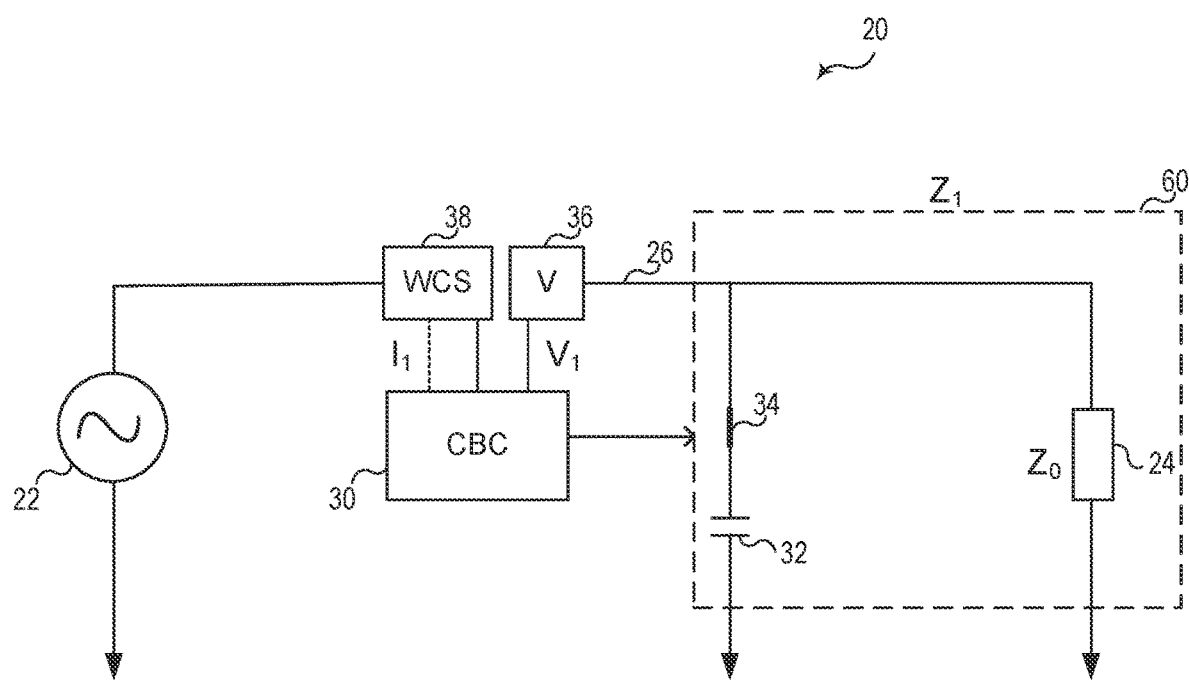
FIG. 2 is a circuit diagram of the power system of FIG. 1 in which the CBC has connected the capacitor bank to the power system, in accordance with an embodiment.

FIG. 2 illustrates a circuit diagram of the electric power delivery system 20 of FIG. 1 with the switching device 34 in a second state (e.g., closed state). Upon closing the switching device 34, the CBC 30 may obtain a second voltage measurement ($V_1$) and a second current measurement ($I_1$) from the voltage sensor 36 and the WCS 38 indicating the voltage and current of the power line 26 while the switching device is in the second state in which the capacitor bank 32 is electrically connected to the power line 26. A second equivalent load impedance ($Z_1$) of the electric power system 20 may be determined as:

$$Z_1 = \frac{V_1}{I_1} \qquad \text{Eq. 2}$$

where $Z_1$ represents the combined load impedance of the capacitor bank and the equivalent load impedance $Z_0$, which may be given by the equation:

$$Z_1 = \frac{Z_0 Z_C}{(Z_0 + Z_C)} \qquad \text{Eq. 3}$$

where $Z_0$ is the first equivalent load impedance of the loads on the power line 26 without the capacitor bank and $Z_C$ is the capacitor bank load impedance. Solving for $Z_C$:

$$Z_C = \frac{Z_0 Z_1}{(Z_0 - Z_1)} \qquad \text{Eq. 4}$$

The capacitor bank may be sized according to the volt-ampere reactive (VARs) provided by the capacitor bank. As such, the VARs being delivered by the capacitor bank may be given by:

$$Q_{C1} = \frac{V_1^2}{\text{Im}(Z_C)} \qquad \text{Eq. 5}$$

where $V_1$ is the voltage measurement while the capacitor bank is electrically connected and Im is a function that takes the imaginary part of the capacitor bank load impedance.

The capacitor bank size given by manufacturers is based on the rated voltage of the power line 26 Because the measured kVARs of equation (5) depend on the voltage ($V_1$), the kVARs from measured voltages may be scaled to the rated voltage to determine the capacitor bank size. The estimated capacitor bank size may be computed as:

$$Q_{CS} = \frac{V_{rated}^2}{V_1^2} Q_{C1} = \frac{V_{Rated}^2}{\text{Im}(Z_C)} \qquad \text{Eq. 6}$$

where $V_{rated}$ is the rated voltage of the line-to-neutral. The CBC 30 may automatically determine a first capacitor bank size estimate using the rated voltage and the first and second voltage and current measurements via equations 1-6.

Figure 3:
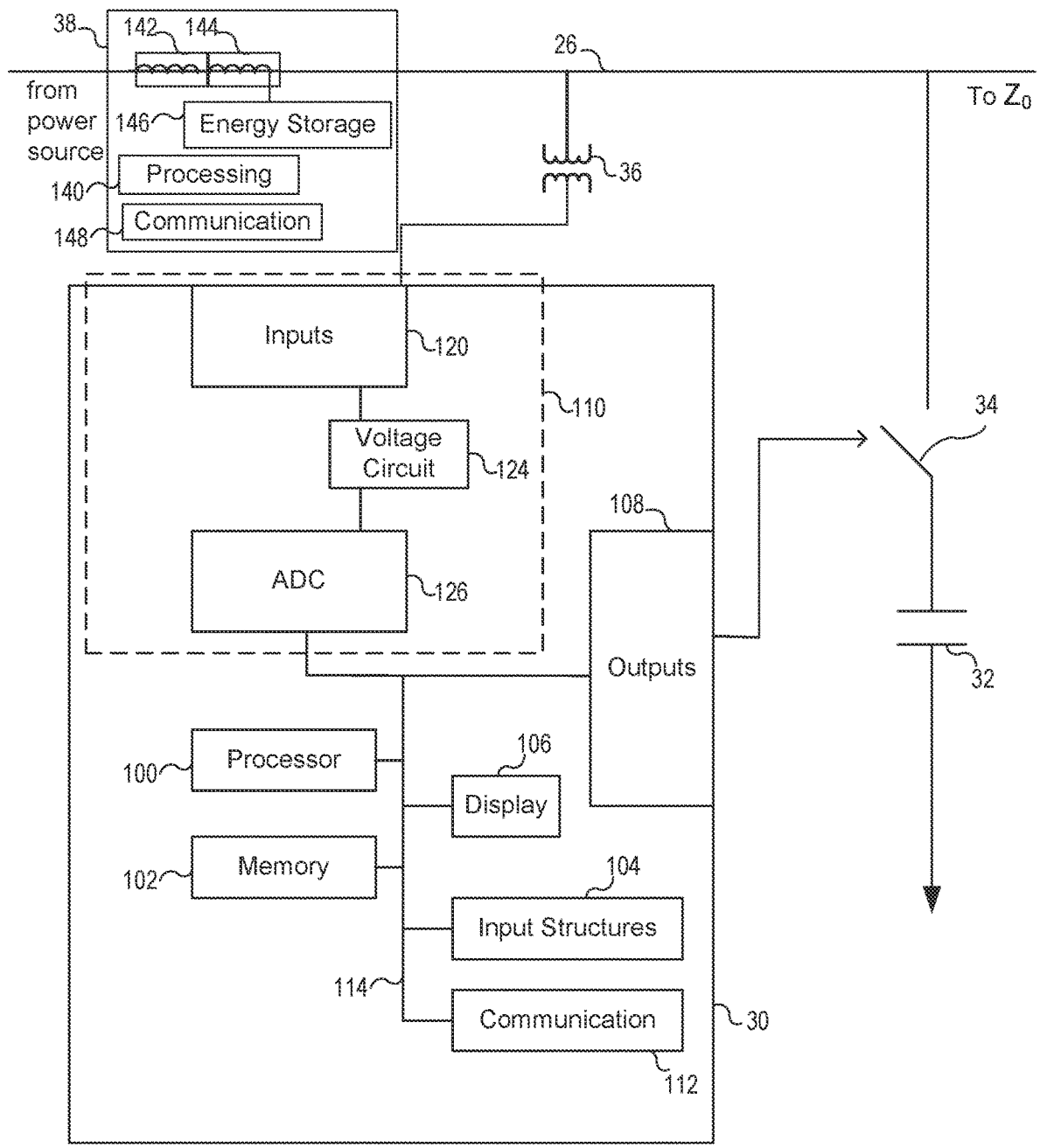
FIG. 3 is a block diagram of the CBC and a wireless current sensor on the power system of FIG. 1, in accordance with an embodiment.

FIG. 3 is an embodiment of a block diagram of a CBC 30 that uses voltage measurements and current measurements to determine the size of a capacitor bank. As illustrated, the CBC 30 communicates wirelessly with the WCS 38 to obtain current measurements of the power line 26. Further, the CBC 30 may be communicatively coupled to a voltage sensor 36, such as a potential transformer (PT) or a control potential transformer (CPT), to obtain voltage measurements of the power line.

In the illustrated embodiment, the CBC 30 includes a processor 100, a computer-readable storage medium 102, input structures 104, a display 106, output circuitry 108, sensor circuitry 110, and communication circuitry 112. The CBC 30 may include one or more bus(es) 114 connecting the processor 100 or processing unit(s) to the computer-readable storage medium 102, the input structures 104, the display 106, the output circuitry 108, sensor circuitry 110, and/or the communication circuitry 112. The computer-readable storage medium 102 be embodied as memory, such as random access memory (RAM), read only memory (ROM), or a combination thereof, and may include or interface with software, hardware, or firmware modules for implementing various portions of the systems and methods described herein. The computer-readable storage medium 102 may be the repository of one or more modules and/or executable instructions configured to implement any of the processes described herein.

The processor 100 may process inputs received via the sensor circuitry 110 and the communication circuitry 112. The processor 100 may operate using any number of processing rates and architectures. The processor 100 may be configured to perform various algorithms and calculations described herein using computer executable instructions stored on computer-readable storage medium 102. The processor 100 may be embodied as a microprocessor. In certain embodiments, the processor 100 and/or the computer-readable storage medium 102 may be embodied as discrete electrical components, a general purpose integrated circuit, one or more Application Specific Integrated Circuits ("ASICs"), a Field Programmable Gate Array ("FPGA"), and/or other programmable logic devices. The processor 100 and/or the computer-readable storage medium 102 may be referred to generally as processing circuitry.

As illustrated, the sensor circuitry 110 may include, for example, input pins 120 or connectors that receive voltage signal(s) from the voltage sensor 36. The sensor circuitry 110 may transform the voltage signals using an internal voltage circuit 124 to a level that may be measured (e.g., via internal transformers), and sample the signals using, for example, A/D converter(s) 126 to produce digital signals representative of measured voltage on the power line 26 The A/D converter 126 may be connected to the processor 100 by way of the bus 114, through which digitized representations of voltage signals may be transmitted to the processor 100.

The communication circuitry 112 may include communication ports, such as ethernet and serial ports. In some embodiments, the CBC 30 may remotely control switches of the capacitor banks using by communicating using the ethernet or serial ports. The communication circuitry 112 may include a wireless transceiver to communicate wirelessly with the WCS 38. The CBC 30 may include a display screen 106 that displays information to notify an operator of operating parameters of the electric power delivery system 20, such as current measurements, voltage measurements, capacitor bank status, power flow direction, etc. The input structures 104 may include buttons, controls, universal serial bus (USB) ports, or the like, to allow a user to provide input settings to the CBC 30. In some embodiments, the display 106 may be a touchscreen display.

The output circuitry 108 may include one or more output pins or connectors that electrically connect the CBC 30 to the switching device 34 to allow the processor 100 to send control signals to the switching device 34 to control connection or disconnection of the capacitor bank 32 to the power line 26.

The CBC 30 may be communicatively coupled to the switching device(s) 34 to send signal(s) to the switching device(s) 34 to electrically connect the capacitor bank 32 to or disconnect the capacitor bank 32 from the power line 26. The switching device 34 may be any suitable switching device or combination of devices that connect or disconnect the capacitor bank 32, such as metal-oxide-semiconductor field-effect transistors (MOSFETs), relays, switches, etc. While illustrated as a single phase of a power system 20, the switching device 34 may include individual switching devices for each phase of the power line 26 to control connecting/disconnecting each phase separately or may include a ganged switching device that connects/disconnects each of the phases together.

The WCS 38 may include processing circuitry 140, a current sensor 142, power harvesting circuitry 144, an energy storage device 146, and communication circuitry 148. The processing circuitry 140 may include a microprocessor, memory, and/or discrete circuit components (e.g., ADC) for digitizing current measurements. The WCS 38 may obtain current measurements via the current sensor 142, such as a current transformer (CT) and may harvest electrical energy from the power line 26 via the power harvesting circuitry 144, which may be embodied as another CT. In some embodiments, the current sensing CT and the power harvesting CT may be combined as a single CT. The WCS 38 may store electrical energy harvested by the power harvesting circuitry in the energy storage device 146, such as a rechargeable battery, a charging capacitor, or the like. The communication circuitry 148 may include a wireless transceiver that is capable of communicating wireless signals to the CBC 30.

The WCS 38 may obtain current signals via the current sensor 142, measure the current signals via the processing circuitry 140, and communicate the current measurements via the communication circuitry 148. The WCS 38 may perform these operations by using electrical energy harvested from the power line 26 via the power harvesting circuitry 144 and/or using electrical energy stored in the energy storage device 146. The WCS 38 may be limited in the amount of electrical energy available to be obtained via the CT. Due to the limited electrical energy, the WCS 38 may be limited to obtaining current measurements at a rate slower than wired or line post current sensors. For example, the WCS 38 may harvest electrical energy for a period of time (e.g., 1 second, 5 seconds, 10 seconds, etc.) to allow the energy storage device WCS 38 to charge to a sufficient level to obtain a current measurement and communicate the current measurement to the CBC 30. That is, the sampling rate of WCS 38 may be slower than the sampling rate desired for determining the capacitor bank size. More particularly, loads on the power system can change within a shorter period of time than the sampling rate of the WCS 38 may obtain consecutive samples during normal operation.

As explained below, the CBC 30 may perform techniques to automatically determine the capacitor bank size while accounting for the rapid changes of loads as well as the operating limitations of the WCS 38. More particularly, a first technique may be used that obtains filtered averages of capacitor bank size estimates and averages the filtered averages of the capacitor bank estimates to obtain an averaged capacitor bank size estimate. A second technique may involve a communication scheme between the WCS 38 and the CBC 30. The first and second techniques may be used to address the changing loads of the power system and the power limitations of the WCS 38.

Figure 4:
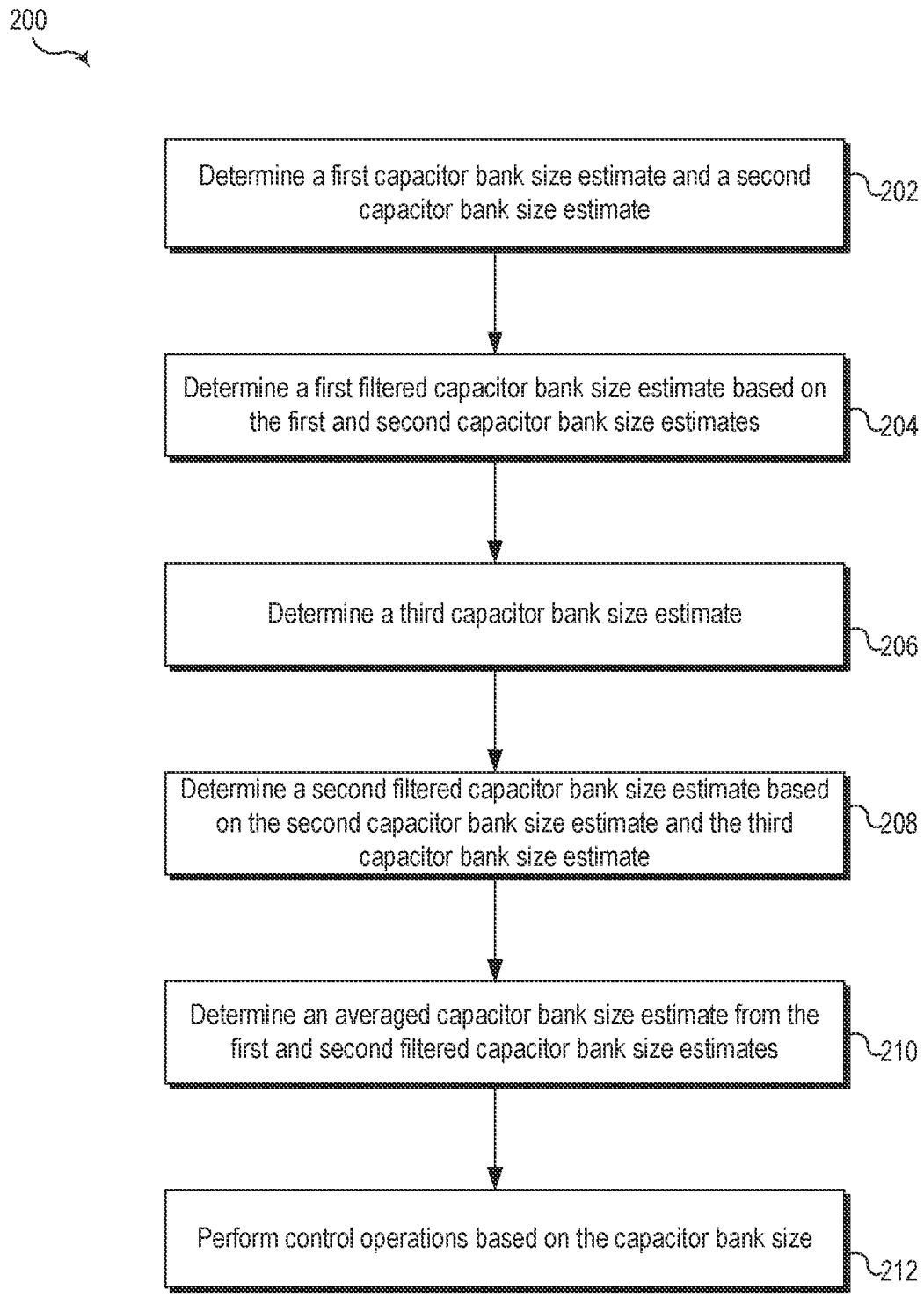
FIG. 4 is a flow diagram of a process performed by the CBC of FIG. 1 to determine the capacitor bank size using a first technique, in accordance with an embodiment.

FIG. 4 is a flowchart of a process 200 that may be performed by the CBC 30 to determine the size of the capacitor bank 32 with a WCS 38, in accordance with a first technique. The process 200 may be stored as instructions on the memory 102 to be executed as instructions (e.g., code) by the processor 100.

At block 202, the CBC 30 may receive user inputs indicating the rated voltage of the power line 26. The CBC 30 may obtain voltage measurements ($V_0$, $V_1$) and current measurements ($I_0$, $I_1$) while the switching device 34 is in an open state and while the switching device 34 is in a closed state a first time, as described above. The voltage and current measurements may be obtained proximate in time to the switching of the switching device 34. For example, the WCS 38 may obtain measurements at X second intervals. The CBC 30 may use the current measurement obtained immediately prior to closing of the switch opened, send a signal to close the switch, and use the current measurement obtained immediately following the signal to close the switch, thereby limiting changes of loads on the power system during the measurements. Similarly, the CBC 30 may time align the voltage measurements obtained with the time at which the current measurements are obtained. The processor 100 may determine a first capacitor bank size estimate by using the voltage measurements and current measurements from when the capacitor bank is connected and disconnected via the switching device in the open and closed states using equations 1-6. The processor 100 may repeat the process and obtain voltage measurements and current measurements while the switching device 34 is again in an open state and while the switching device 34 is again in a closed state a second time. The second time may be a period of time following the first time (e.g., 5 seconds, 10 seconds, 20 seconds, etc.).

At block 204, the processor 100 may determine a first filtered capacitor bank size estimate based in part on the first capacitor bank size estimate and the second capacitor bank size estimate. Although two times are described herein, this process can then be performed N times by opening and closing the capacitor bank and obtaining voltage and current measurements each time.

Figure 5:
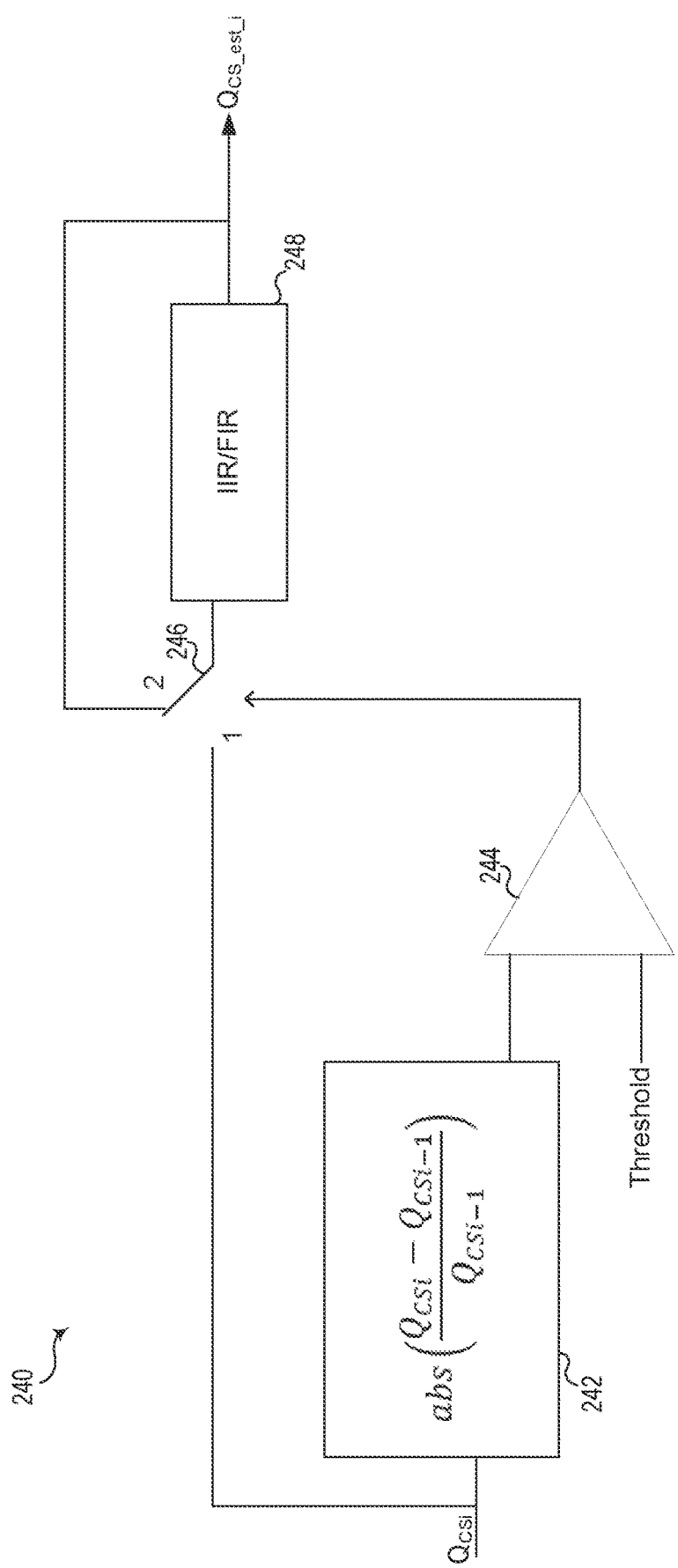
FIG. 5 is a logic diagram for filtering the capacitor bank sizes in the process performed in FIG. 4, in accordance with an embodiment.

FIG. 5 is a block diagram of a process 240 performed by the processor 100 to determine a filtered capacitor bank size estimate. As illustrated, the processor 100 may obtain an ith capacitor bank size estimate ($Q_{CSi}$).

The processor 100 may determine a difference quantity 242 between the present (ith) capacitor bank size estimate and the previous (i−1) capacitor bank size estimate. The difference quantity may be determined as:

$$\text{abs}\left(\frac{Q_{CSi} - Q_{CSi-1}}{Q_{CSi-1}}\right) \qquad \text{Eq. 7}$$

The difference quantity 242 may be compared to a difference threshold via a comparator 244 to determine whether the ith capacitor bank size estimate is accurate. If the ith capacitor bank size estimate has a difference quantity 242 that is greater than a threshold value, then the processor 100 may discard, with the switch 246 in the 2 position, the capacitor bank size estimate from the first filtered capacitor bank size estimate ($Q_{CS\_est\_i}$). Otherwise, the second capacitor bank size estimate may be accepted and included in the first filtered capacitor bank size estimate with the switch 246 in the 1 position. The set of accepted capacitor bank size estimates may be filtered via an infinite impulse response (IIR) and/or finite impulse response (FIR) filter 248 to obtain the first filtered capacitor bank size estimate.

Returning to FIG. 4, at block 206, the processor 100 may obtain a third capacitor bank size estimate via voltage and current measurements obtained with the switching device opened and closed. At block 208, the processor 100 may then determine a second filtered capacitor bank size estimate based on the second capacitor bank size estimate and a third capacitor bank size estimate using the process 240 again.

At block 210, to obtain better accuracy of the capacitor bank size, the first filtered capacitor bank size and the second filtered capacitor bank size may then be averaged to obtain an averaged capacitor bank size. The steps above may be performed M times such that:

$$Q_{capacitor\_size} = \frac{\sum_{i=1}^{M} Q_{CS\_est\_i}}{M} \qquad \text{Eq. 7}$$

where $Q_{CS\_est\_i}$ is the ith filtered capacitor bank size estimate from the process of FIG. 5.

By averaging M filtered capacitor bank sizes, and by obtaining N capacitor bank samples and filtering each of the individual capacitor bank size estimates, the CBC 30 is able to ensure the accuracy of the capacitor bank size when loads may change during the capacitor bank sizing process.

In some embodiments, the computer-readable medium 102 may include a set of standard values of capacitor bank sizes in a look-up table of standard values. The processor 100 may select, from the look-up table, the closest standard capacitor size to the averaged capacitor bank size estimate. For example, each standard size may be associated with a range of sizes. The processor 100 may select the standard size associated with the range of sizes in which the estimated size falls within.

The CBC 30 may provide, via the display 106, a prompt to an operator indicating the determined capacitor bank size to allow the operator to confirm the size of the capacitor bank. In other embodiments, the CBC 30 may simply set the capacitor bank size based on the calculations.

At block 212, the CBC 30 may then perform control operations based on the capacitor bank size. For example, the CBC 30 may perform VAR control, PF control, voltage control, current control, or any combination thereof on each of the phases of the power system. The CBC 30 may control the VARs on the power line by using the VARs that the capacitor bank is estimated to add or remove from operating the switching device.

Figure 6:
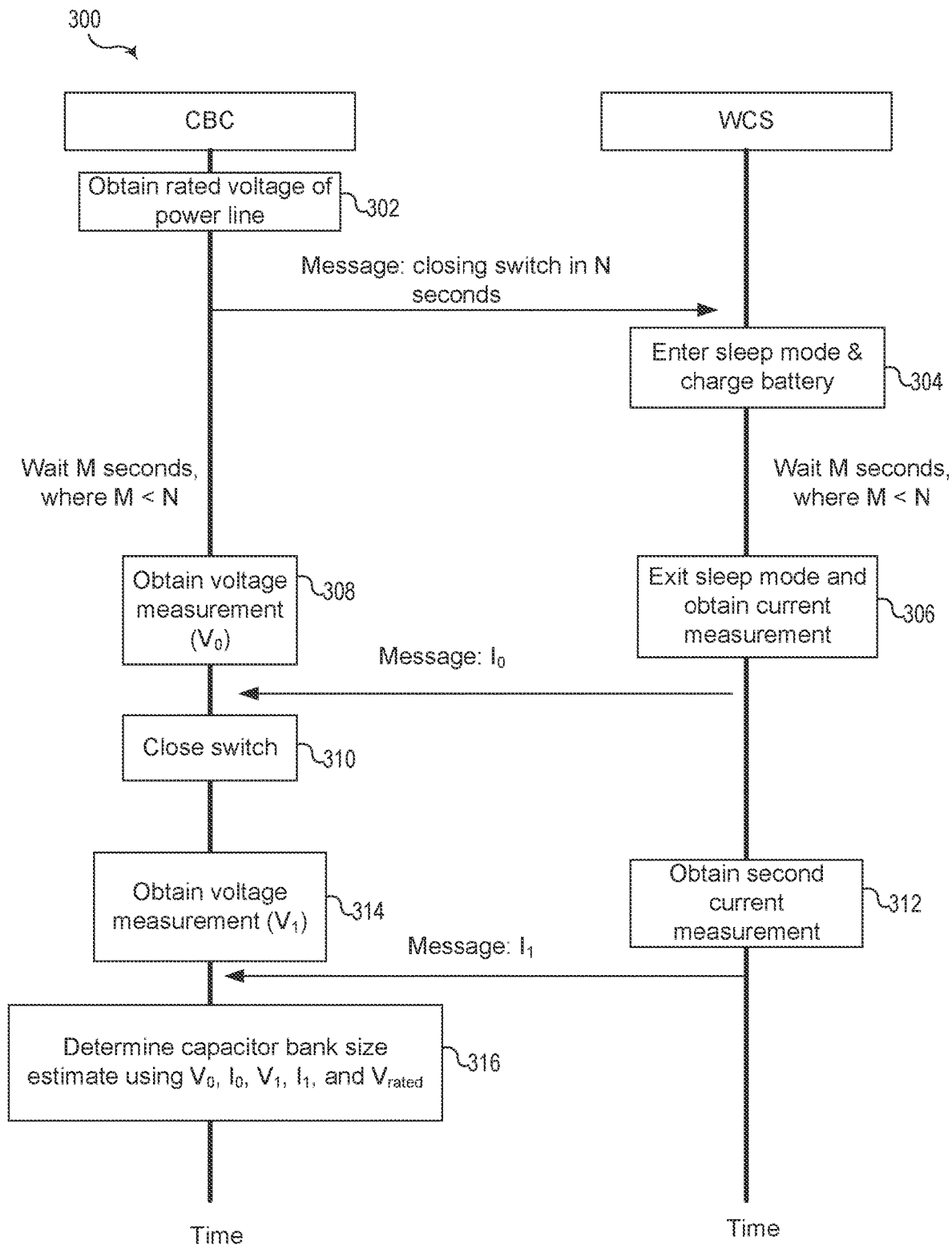
FIG. 6 is a timing diagram of a scheme performed between the CBC of FIG. 1 and the wireless current sensor to determine the capacitor bank size using a second technique, in accordance with an embodiment.

FIG. 6 is a timing diagram of a scheme/protocol that may be performed by the CBC 30 to determine the size of the capacitor bank 32 with a WCS 38, in accordance with a second technique. The CBC 30 may receive a user input of a rated voltage of the power line 26 during commissioning of the CBC 30 (block 302). The CBC 30 may send a command to the WCS 38 indicating that the CBC 30 will operate a capacitor bank switching device at an operating time. That is, the CBC 30 may schedule the switching device 34 to be switched from an open state to a closed state at a later point in time and may communicate the scheduling to the WCS 38. For example, the CBC 30 may send the command indicating that the CBC 30 will close the switching device 34 at an operating time in N number of seconds (e.g., 5, 10, 15, 20 seconds etc.) and request that the WCS 38 measure the current before and after the switching device 34 is closed.

When the WCS 38 receives the command, the WCS 38 may switch to a low power mode (e.g., a sleep mode (block 304)) and start to save harvested energy for M seconds, where M is smaller than N, to have sufficient energy to obtain two or more current measurements. For example, if the switching device is expected to close at 10 seconds, the WCS 38 may save harvested energy for 8 seconds. Prior to the operating time, the WCS 38 may then exit the low power mode and enter an operating mode that uses more power to obtain and communicate the current measurements. The WCS 38 may measure the current before the switching device 34 is closed and send the first current measurement ($I_0$) and zero crossings to the CBC 30 (block 306). Prior to the operating time, the CBC 30 may obtain voltage measurements ($V_0$) via the voltage sensor (block 308). At the operating time, the CBC 30 may close the switch (block 310) as planned to connect the capacitor bank.

Following the operating time, the WCS 38 may then measure the current and send the current measurement ($I_1$) and zero crossings to the CBC 30 (block 312). In this example, the WCS 38 may wait for 5 seconds (or an amount of time to ensure that the switching device 34 has already closed and to ensure any transients caused by operating the switching device have cleared). Following the operating time, the CBC 30 may obtain voltage measurements ($V_1$) via the voltage sensor (block 314). In some embodiments, the CBC 30 may obtain the voltage measurements $V_0$ and $V_1$ at approximately the same time (e.g., within 1 second, 2 seconds, 3 seconds, etc.) of when the WCS 38 is expected to obtain the current measurements $I_0$ and $I_1$ to ensure accuracy of the impedance calculations.

The CBC 30 may then determine a first capacitor bank size estimate (block 316) based on the rated voltage, the first current measurement, the first voltage measurement, the second current measurement, and the second voltage measurement using equations 1-6. The CBC 30 may then repeat the process 300 above with the WCS 38 to obtain a second capacitor bank size estimate.

To improve accuracy of classifying the capacitor bank size, the CBC 30 may continue to repeat the steps described above for N times. An averaged capacitor bank size estimate may be obtained as:

$$Q_{capacitor\_size} = \frac{\sum_{i=1}^{N} Q_{CSi}}{N} \quad \text{Eq. 8}$$

where $Q_{CSi}$ is the ith capacitor bank size estimate.

Similar to the first technique, the processor 100 may then select the closest standard capacitor bank size from a set of standard values in a look-up table. The processor 100 may select the standard size associated with the range of sizes in which the estimated size falls within. The CBC 30 may provide, via the display 106, a prompt to an operator indicating the determined capacitor bank size to allow the operator to confirm the size of the capacitor bank. In other embodiments, the CBC 30 may simply set the capacitor bank size based on the calculations. The CBC 30 may then perform control operations based on the capacitor bank size, such as VAR control, PF control, voltage control, current control, or any combination thereof on each of the phases of the power system. The CBC 30 may control the VARs on the power line by using the VARs that the capacitor bank is estimated to add or remove from operating the switching device. The CBC 30 may use root means squared (RMS), peak, or other suitable measurements as the current and/or voltage measurements.

By having a scheme in which operation of the switching device is scheduled to occur, the WCS 38 may store energy to obtain two or more samples proximate in time to the operation of the switching device, thereby reducing load changes between the first and second measurements. In both techniques, the CBC 30 may have a reduced number of inputs to operate due to automatically determining the capacitor bank size. By reducing the inputs to operate the CBC 30, installation is less complex, which may reduce the number of errors and/or time for installation. Although the above embodiments have been described with respect to a phase of a power line, the above process may be performed using multi-phase (e.g., three phase) measurements to determine the size of the capacitor bank.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A capacitor bank controller (CBC) configured to control a capacitor bank of a power system, comprising:
   memory; and
   a processor operatively coupled to the memory, wherein the processor is configured to execute instructions on the memory to perform a process that causes the CBC to:
      determine a first capacitor bank size estimate by using voltage measurements and current measurements of the power system from when the capacitor bank is open and when the capacitor bank is closed a first time;
      determining a second capacitor bank size estimate by using voltage measurements and current measurements from when the capacitor bank is open and when the capacitor bank is closed a second time;
      determining a first filtered capacitor bank size estimate based at least in part on the first capacitor bank size estimate and the second capacitor bank size estimate; and
      control operation of the capacitor bank based at least in part on the first filtered capacitor bank size estimate.

2. The CBC of claim 1, wherein the processor is configured to:
   determine a difference quantity of the first capacitor bank size estimate and the second capacitor bank size estimate;
   compare the difference quantity to a threshold; and
   discard the second capacitor bank size estimate when the difference quantity is above the threshold and include the second capacitor bank size estimate in determining the first filtered capacitor bank size estimate otherwise.

3. The CBC of claim 2, wherein the difference quantity is determined as an absolute value of a difference between the second capacitor bank size estimate and the first capacitor bank size estimate divided by the first capacitor bank size estimate.

4. The CBC of claim 1, wherein the first filtered capacitor bank size estimate is filtered via a finite impulse response filter or an infinite impulse response filter.

5. The CBC of claim 1, comprising a wireless current sensor (WCS) configured to harvest electrical energy from a power line of the power system to operate, wherein the WCS is configured to communicate the current measurements wirelessly to the CBC.

6. The CBC of claim 1, wherein the processor is configured to:
   determining a second filtered capacitor bank size estimate based at least in part on the second capacitor bank size estimate and a third capacitor bank size estimate; and
   averaging the first filtered capacitor bank size estimate and the second filtered capacitor bank size estimate to obtain an averaged capacitor bank size estimate.

7. The CBC of claim 6, wherein the processor is configured to:
   select, from a list of standard values of capacitor bank sizes, the closest size to the averaged capacitor bank size estimate to obtain a selected capacitor bank size; and
   control operation of the capacitor bank using the selected capacitor bank size.

8. A system, comprising:
   a wireless current sensor (WCS) configured to:
      wait following receiving a command indicating that a capacitor bank controller will operate a capacitor bank switch at an operating time;
      prior to the operating time, obtain a first current measurement of the power system with the capacitor bank in a first state;

following the operating time, obtain a second current measurement of the power system with the capacitor bank in a second state, different from the first state, send the first current measurement and the second current measurement to a capacitor bank controller (CBC);

a voltage sensor; and the CBC configured to:
  obtain a rated voltage of the power system;
  send the command to the WCS;
  prior to the operating time, obtain a first voltage measurement from the voltage sensor of the power system with the capacitor bank in the first state;
  following the operating time, obtain a second voltage measurement from the voltage sensor of the power system with the capacitor bank in the second state;
  obtain the first current measurement and the second current measurement from the WCS;
  determine a first capacitor bank size estimate based on the rated voltage, the first current measurement and the first voltage measurement prior to the operating time, and the second current measurement and the second voltage measurement following the operating time; and
  control operation of the capacitor bank based at least in part on the first capacitor bank size estimate.

9. The system of claim 8, wherein the WCS comprises power harvesting circuitry and a power storage device, wherein the power harvesting circuitry is configured to harvest electrical energy from a power line of the power system, and wherein the WCS is configured to wait following receiving the command to charge the power storage device of the WCS, via the power harvesting circuitry, to a level that allows the WCS to obtain at least two current measurements.

10. The system of claim 8, wherein the WCS is configured to, upon receiving the command, enter a low power mode until a first measurement time; and
  at the first measurement time, wake the WCS from the low power mode and obtain the first current measurement.

11. The system of claim 10, wherein the WCS is configured to, following obtaining the first current measurement, wait until a second measurement time to allow sufficient time to ensure that the capacitor bank has changed between the first state and the second state.

12. The system of claim 10, wherein the first state comprises a switching device of the capacitor bank in an open position, thereby having the capacitor bank disconnected from the power system, and wherein the second state comprises the switching device of the capacitor bank in a closed position, thereby having the capacitor bank connected to the power system.

13. The system of claim 10, wherein the CBC is configured to:
  determine a second capacitor bank size estimate;
  averaging the first capacitor bank size estimate and the second capacitor bank size estimate to obtain an averaged capacitor bank size estimate.

14. The system of claim 13, wherein the CBC is configured to:

select, from a list of standard values of capacitor bank sizes, a closest size to the averaged capacitor bank size estimate to obtain a selected capacitor bank size; and
control operation of the capacitor bank using the selected capacitor bank size.

15. A method, comprising:
  obtaining, via a capacitor bank controller (CBC), a rated voltage of a power line in a power system;
  sending, via the CBC, a command to a wireless current sensor (WCS) indicating that the CBC will operate a capacitor bank switch at an operating time;
  prior to the operating time, obtain a first current measurement via the WCS and obtain a first voltage measurement via a voltage sensor connected to the CBC;
  following the operating time, obtain a second current measurement via the WCS and obtain a second voltage measurement via the voltage sensor;
  determine a first estimated capacitor bank size based on the rated voltage, the first current measurement, the first voltage measurement, the second current measurement, and the second voltage measurement; and
  control, via the CBC, operation of the capacitor bank based at least in part on the first estimated capacitor bank size.

16. The method of claim 15, wherein the first state comprises a switching device of the capacitor bank in an open position, thereby having the capacitor bank disconnected from the power system, and wherein the second state comprises the switching device of the capacitor bank in a closed position, thereby having the capacitor bank connected to the power system.

17. The method of claim 15, wherein the CBC is configured to:
  determine a second capacitor bank size estimate; and
  averaging the first capacitor bank size estimate and the second capacitor bank size estimate to obtain an averaged capacitor bank size estimate.

18. The method of claim 17, wherein the CBC is configured to:
  select, from a list of standard values of capacitor bank sizes, a closest size to the averaged capacitor bank size estimate to obtain a selected capacitor bank size; and
  control operation of the capacitor bank using the selected capacitor bank size.

19. The method of claim 15, wherein the WCS comprises power harvesting circuitry and a power storage device, wherein the power harvesting circuitry is configured to harvest electrical energy from a power line of the power system, and wherein the WCS is configured to wait following receiving the command to charge the power storage device of the WCS, via the power harvesting circuitry, to a level that allows the WCS to obtain at least two current measurements.

20. The method of claim 15, wherein the WCS is configured to, upon receiving the command, enter a low power mode until a first measurement time; and
  at the first measurement time, wake the WCS from the low power mode and obtain the first current measurement.

* * * * *